United States Patent
Millar et al.

(12) 
(10) Patent No.: US 6,490,225 B1
(45) Date of Patent: Dec. 3, 2002

(54) MEMORY HAVING A SYNCHRONOUS CONTROLLER AND ASYNCHRONOUS ARRAY AND METHOD THEREOF

(75) Inventors: Brian M. Millar, Austin, TX (US); Tom Andre, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/004,721

(22) Filed: Dec. 4, 2001

(51) Int. Cl.[7] ................................................. G11C 8/00
(52) U.S. Cl. ........................................ 365/233; 365/195
(58) Field of Search ................................. 365/233, 195, 365/222

(56) References Cited

U.S. PATENT DOCUMENTS

| | | | |
|---|---|---|---|
| 5,276,858 A | * 1/1994 | Oak et al. | 395/550 |
| 5,978,929 A | * 11/1999 | Covino et al. | 713/503 |
| 6,272,588 B1 | 8/2001 | Johnston et al. | |
| 6,288,959 B1 | 9/2001 | OuYang et al. | |

OTHER PUBLICATIONS

Silicon7's 8–Mbit SRAM Sports Single–Transistor Cell, Sep. 11, 2001.

1T–SRAM Ultra–High Density SRAM 0.18 Micron Pure Logic, 1999.

* cited by examiner

*Primary Examiner*—Son T. Dinh

(57) ABSTRACT

A memory controller portion of a DRAM is synchronized to a system clock, while an array portion of the DRAM is allowed to process signals at the array's natural frequency—independent of fixed timing parameters. By allowing the array portion to function at its natural frequency, the array's performance is not limited to "worst case" parameters; instead the DRAM can achieve maximize array performance at all voltage and temperature corners. The controller portion of the DRAM initiates an array access cycle, then waits until the array portion returns a data-valid signal. Since the array portion of the DRAM operates at its own natural frequency the data-valid signal can be completely asynchronous to the controller portion of the DRAM, which is operating in synchronization with a system clock. In order to ensure that the data-valid signal is latched properly, the controller sends an early version of the system clock to the data valid circuitry in the array portion of the DRAM. This early version of the system clock, known as the clock lockout signal, is used to effectively synchronize the output of the array portion to the controller portion, and thereby to the system clock.

18 Claims, 7 Drawing Sheets

MEMORY HAVING A SYNCHRONOUS CONTROLLER AND ASYNCHRONOUS ARRAY AND METHOD THEREOF

FIELD OF THE DISCLOSURE

The present disclosure relates generally to dynamic random access memories (DRAM), and more particularly to DRAM controller-array configurations.

BACKGROUND

A primary consideration in designing random access memory (RAM) is the speed at which the RAM can respond to access requests. If the RAM is used in a computing system and the RAM is too slow in responding to either read or write access requests, then the overall performance of the system can be degraded. The speed of the RAM becomes even more important when used with today's faster processors.

Some types of conventional RAM, such as static random access memory (SRAM), have faster access times and provide generally superior performance to other types of RAM, but are physically large and expensive. Other types of conventional RAM, such as dynamic random access memory (DRAM), are physically smaller and less expensive than SRAM, but generally have slower access times. In attempting to gain the benefits of both SRAM and DRAM in systems requiring fast memory access, designers often use DRAM for "bulk" storage, and SRAM to cache data traveling between a processor and the DRAM. Using SRAM to cache data in this manner provides a performance improvement over the use of conventional DRAM alone, by reducing the number of DRAM accesses required, and yet still allowing the largest portion of RAM to be relatively inexpensive.

In part because of the success of the SRAM/DRAM combination in which data is normally read from sequential addresses within a DRAM and cached in an SRAM for later random access, traditional DRAM designs have focused on improving the sequential output speed of the DRAM. This improvement in sequential access speed often comes at the expense of the DRAM's random access speed. Unfortunately, this sacrifice of random access speed for improved sequential access speed is not acceptable in all situations. For example, when a DRAM is used without an SRAM cache, the DRAM will need to make many more random accesses. As a result of the increased number of random accesses required by a DRAM operating without an SRAM cache, a DRAM optimized for sequential access, will not provide optimum overall performance in this situation.

Additionally, traditional DRAM designs require the array portion of a DRAM to operate according to fixed timing parameters. For example, in extended-data-out-DRAMs (EDO) a memory controller governs the timing within the DRAM's memory array by asserting and de-asserting separate timing signals. Similarly, in synchronous DRAMs (SDRAM), a memory controller governs the internal timing of the DRAM's memory array activity based on a number of clock cycles.

Designers wishing to obtain optimum performance using fixed timing parameters such as those used in conventional EDO or SDRAM, must design the DRAM to operate at a particular frequency. Consider the case where the DRAM is designed for use in a system that is being developed to operate at 100 MHz, but in fact the system operates at only 98.9 MHz when completed. This slight change in operating frequency could be enough to reduce the access time of the DRAM by a full clock cycle, and therefore require re-engineering of the DRAM, software, or an interrelated system.

It should be apparent from the above discussion that conventional DRAM technology is less than perfect, and it would be advantageous to have a memory that overcame at least some of the limitations disclosed above.

BRIEF DESCRIPTION OF THE FIGURES

Various display objects, advantages, features and characteristics of the present disclosure, as well as methods, operation and functions of related elements of structure, and the combination of parts and economies of manufacture, will become apparent upon consideration of the following description and claims with reference to the accompanying drawings, all of which form a part of this specification.

DETAILED DESCRIPTION OF THE FIGURES

FIGS. 1–8 illustrate various aspects of an improved Dynamic Random Access Memory (DRAM) as disclosed herein. A memory controller portion of the DRAM is synchronized to a system clock, while an array portion of the DRAM is allowed to process signals at the array's natural frequency—independent of fixed timing parameters. By allowing the array portion to function at its natural frequency, the array's performance is not limited to "worst case" parameters; instead the DRAM design disclosed herein can maximize the array's performance at all voltage and temperature corners.

Figure 1:
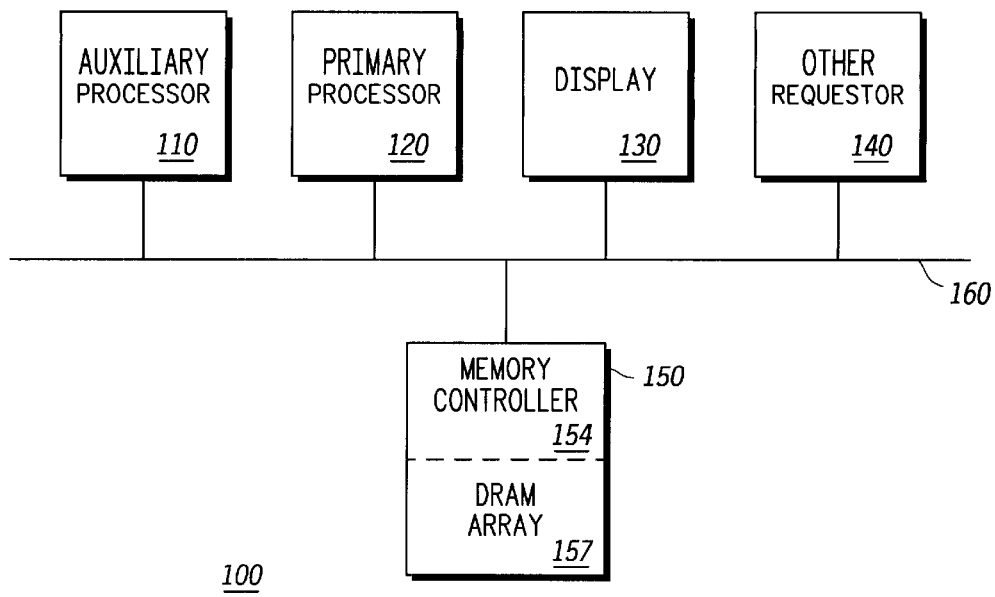
FIG. 1 is a block diagram illustrating a system including a Dynamic Random Access Memory (DRAM) shared by multiple memory users according to an embodiment of the present invention.

Referring first to FIG. 1, one embodiment of a system including a shared DRAM and multiple requesters will be discussed. System 100 includes memory-using devices such as auxiliary processor 110, primary processor 120, display 130, and other requester 140. System 100 also includes DRAM 150 in accordance with the present invention. Memory-using devices 110, 120, 130, and 140 are connected to DRAM 150 via system bus 160. Any communications traveling over system bus 160 from either the memory-using devices or DRAM 150 are synchronized to a common system clock (not illustrated).

System 100 may be implemented for a wireless communication system, although it is by no means so limited, and may include any processing device or system, including those devices and systems employing a memory shared by multiple users. In the case where system 100 is a wireless communication device, auxiliary processor 110 may be a digital signal processor used for manipulating digital signals, primary processor 120 may be a central processing unit (CPU) used to control the overall operation of system 100, other requestor 140 may be a communications processor, and display 130 may be a low-power liquid crystal display (LCD). It will be appreciated that in order to achieve various design goals, other processor and/or display types may be selected by those skilled in the art without departing from the teachings disclosed herein.

DRAM 150, as illustrated, includes memory controller 154 and DRAM array 157. In order to achieve maximum speed under variable temperature, voltage, frequency and processing conditions, it is desirable to allow DRAM 150 to operate at its natural frequency. The natural operating frequency of DRAM array 150 is independent of any fixed timing parameters, such as a system clock, in that the access through the DRAM array 157 is asynchronously self-timed to function under all operating conditions. However, it is also necessary to synchronize the output of DRAM 150 with system bus 160 to allow communications with connected memory-users. In order to achieve both synchronous communications and asynchronous retrieval and storage of data, DRAM 150 is divided into two parts: controller 154, which is synchronized to the same clock used by system bus 160; and DRAM array 157, which operates at its natural frequency independent of fixed timing parameters. In at least one embodiment DRAM 150 is embedded into a monolithic semiconductor device, for example with one or more of 110, 120, 130 and 140. Making DRAM 150 an embedded DRAM can eliminate the overhead of front-end logic on the memory as well as some logic associated with memory controllers, to get the fastest access cycles possible. However, the techniques disclosed herein can be applied to non-embedded DRAM if so desired.

Note that while the distinction between memory controllers and arrays may be somewhat blurred, particularly when discussing embedded memories, unless otherwise noted, the term memory controller as used herein includes most portions of the DRAM that are operating synchronously with a system clock. The term DRAM array refers generally to that portion of the DRAM operating at its natural frequency which is asynchronously related to the system clock, and includes both the memory cells and some circuitry that performs functions which may be conventionally considered as control functions. An exception to this generality is the data valid circuitry (see FIG. 3), which ensures synchronization of the DRAM array's output to the system clock, yet is considered to be physically located in the asynchronous portion of the DRAM.

Figure 2:
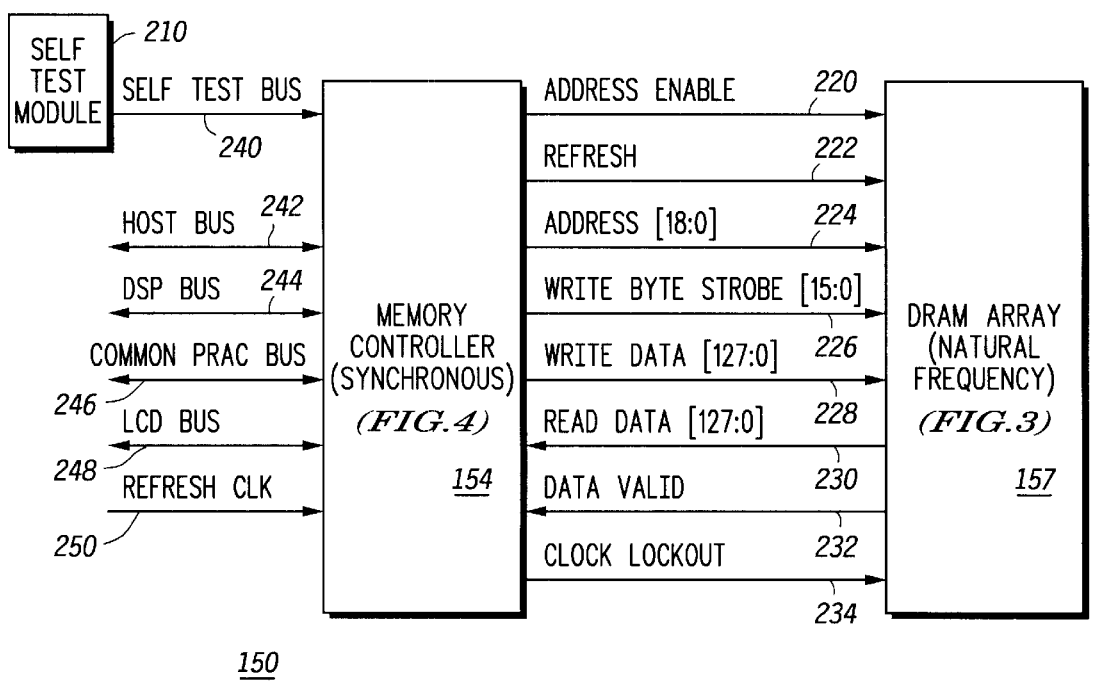
FIG. 2 is a block diagram of an embodiment of the DRAM illustrated in FIG. 1, including a memory controller and a DRAM array.

Referring next to FIG. 2, a particular embodiment of DRAM 150 will be discussed. In the illustrated embodiment, DRAM 150 includes self-test module 210 and self test bus 240, which may be used to verify the operation of both memory controller 154 and DRAM array 157. Memory controller 154 receives and responds to data requests from various memory-users over a series of communication busses which may be shared or separate, including host bus 242, digital signal processing (DSP) bus 244, communications processor bus 246, and LCD bus 248. It will be appreciated that communications busses 242, 244, 246, and 248 may share read lines, write lines, etc. using any suitable bus-sharing protocol without departing from the teachings set forth herein. Memory controller 154 also receives a REFRESH CLOCK signal, used to initiate a DRAM refresh cycle, on refresh clock line 250. Upon receiving access requests from the various memory-users, memory controller 154 determines which memory-user has priority, and delivers the appropriate access requests, any necessary control signals and associated data, to DRAM array 157 via a series of control and data lines.

Any necessary address information is delivered to DRAM array 157 over address bus 224, which includes address lines 0–18. The use of 19 address lines in the illustrated embodiment is appropriate for accessing a DRAM array of 64 Mbits, configured as 128 bit words, however it will be appreciated that the number of address lines used in any particular implementation can be tailored to the configuration and capacity of the DRAM array or to conform to other design constraints.

Address enable line 220 is used in conjunction with address bus 224 to deliver address information from memory controller 154 to DRAM array 157. By asserting address enable line 220, memory controller 154 notifies DRAM array 157 that a precharge phase has ended, thereby allowing address detect logic in DRAM array 157 to begin looking for a new address. During a write operation, memory controller 154 also asserts the appropriate lines of write byte strobe bus 226 to indicate to DRAM array 157 where write data is available.

In preparation for a write operation, data to be stored in DRAM array 157 is delivered from memory controller 154 to DRAM array 157 over write-data bus 228. Read data bus 230 is used to deliver data from DRAM array 157 to memory controller 154 upon completion of a read cycle. FIG. 2 illustrates a DRAM having separate 128 bit read and write data paths, but those skilled in the art may readily adapt the size of the data paths used between memory controller 154 and DRAM array 157 to suit particular devices or systems in which DRAM 150 will be used.

Since DRAM array 157 is operating at its natural frequency, the number of clock cycles needed by DRAM array 157 to complete an operation is not fixed for all temperatures and voltages. At some temperature and voltage corners, the natural frequency of DRAM array 157 may increase, thereby decreasing the number of cycles needed to complete a given access request. In order to allow memory controller 154 to know when DRAM array 157 has completed a particular operation, data valid line 232 is used to provide a DATA VALID signal from DRAM array 157 to memory controller 154 when a particular cycle is complete or about to be completed. For example, when data at the output of DRAM array 157 is ready to be read, DRAM array 157 will assert a DATA VALID signal on data valid line 232. DRAM array 157 also asserts a DATA VALID signal upon completion of a refresh cycle, and upon completion of a write operation.

One may note, however, that it might be possible for DRAM array 157, operating at its natural frequency, to assert a DATA VALID signal at a time when memory controller 154, operating in synchronism with a system clock, is unable to receive data. For example, DRAM array 157 may finish an operation in the middle of a system clock cycle. Since memory controller 154 needs to properly synchronize the data from DRAM array 157 for output to a memory requestor, memory controller 154 may not be able to accept data from DRAM array 157 immediately upon completion of an operation; instead, memory controller 154 may need to wait until the next clock cycle to accept data from DRAM array 157. During times when memory controller 154 is unable to receive data from DRAM array 157, memory controller 154 asserts a CLOCK LOCKOUT signal over clock lockout line 234 to delay assertion of a DATA VALID signal by DRAM array 157. This usage of the CLOCK LOCKOUT signal assures that proper setup and hold times are met for the synchronous logic within the memory controller.

Figure 3:
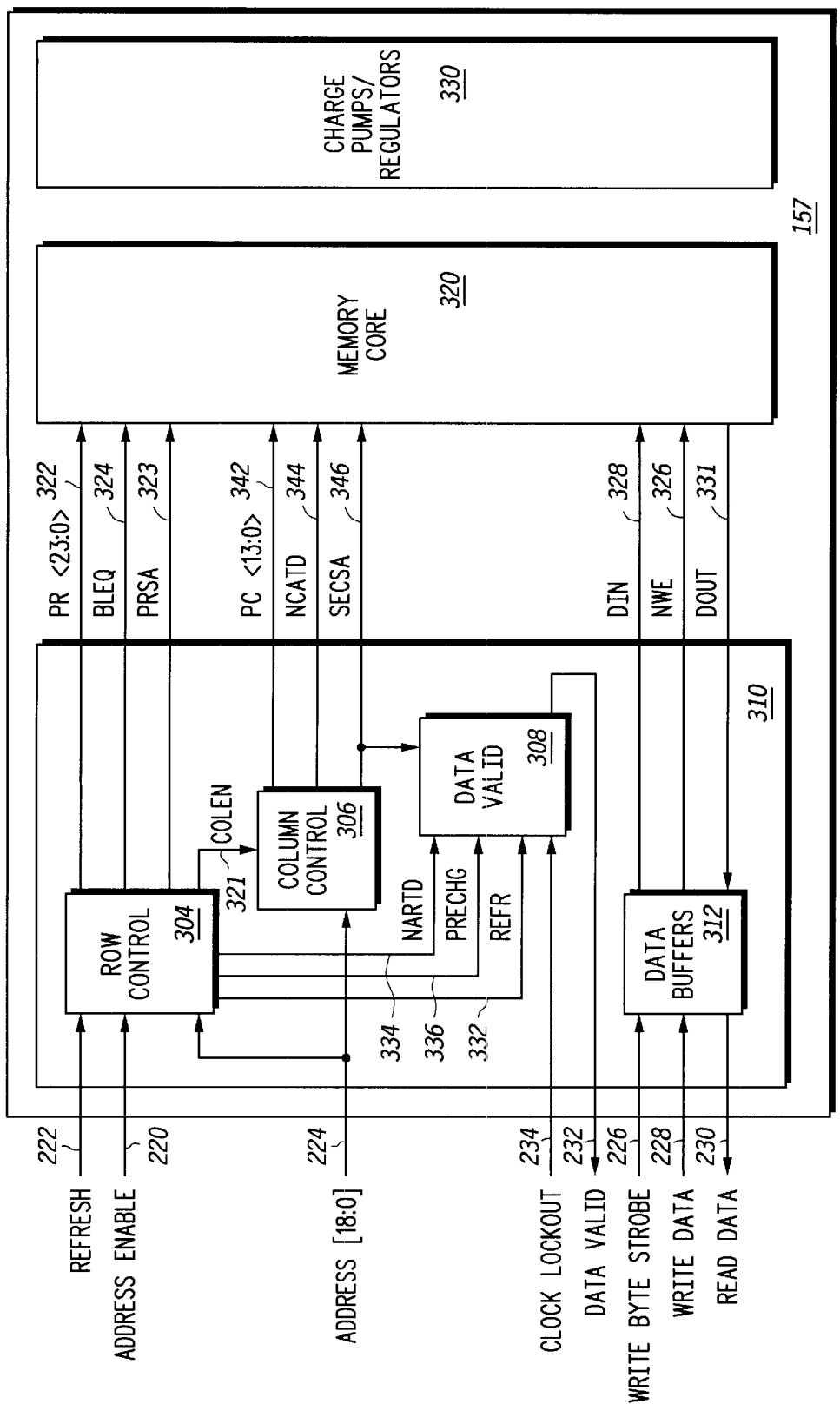
FIG. 3 is a block diagram of one implementation of the DRAM array shown in FIG. 2.

Referring now to FIG. 3, a particular implementation of DRAM array 157 will be discussed. The illustrated embodiment of DRAM array 157 includes three main functional blocks: 1) Interface 310, which performs control and logic functions that allow DRAM array 157 to interface with memory controller 154; 2) memory core 320, which includes the memory cell arrays and associated sense amplifiers (not illustrated) which are the actual storage and access elements of DRAM array 157; and 3) charge pump/regulator block 330, which includes various mechanisms for maintaining proper voltage levels for storing information in memory core 320. Both memory core 320 and charge pump/regulator block 330 can be implemented using methods commonly known to those skilled in the art, and so the discussion of FIG. 3 will be primarily limited to the function and structure of Interface 310.

In at least one embodiment, DRAM array 157 includes row control 304, column control 306, data valid block 308, and data buffers 312. Data buffers 312 receive control signals via write byte strobe bus 226 and data to be written to memory core 320 via write data bus 228. Data buffers 312 deliver data read from memory core 320 over read data bus 230. Data buffers 312 interface with memory core 320 using data-in lines 328 for data to be stored, data-out lines 331 for data read-out of storage, and NWE LINE 326 to control the transfer of data from data-in lines 328 to memory cells (not illustrated) in the memory core 320.

Row control 304 and column control 306 cooperate to decode address information received over address bus 224, and then activate appropriate columns, rows and bits corresponding to the address received. In at least one embodiment, row control 304 monitors address bus 224 using address transition detect (ATD) logic. If it sees any change in the address signals, it begins an access cycle. If the new address is to a different row or column, or if the previous cycle was a pre-charge or refresh cycle, then row control 304 and column control 306 will pre-charge the appropriate row and column. Row control 304 also monitors refresh line 222 to determine when to perform a refresh cycle.

Row control 304 provides pre-decoded row signals to memory core 320 to control word-line selection within memory core 320. Row control 304 also provides PRSA signal 323 to enable the primary sense-amps in memory core 320, and BLEQ signal 324 to control bit-line equalization timing. Row control 304 also provides COLEN signal 321 to column control 306 in order to disable column access during refresh cycles, and to control the timing of the column passgate (not illustrated) in memory core 320 during a random access cycle. Finally, row control 304 provides refresh mode indicator 336, pre-charge indicator 336, and row address transition detection signal (NRATD) 334 to data valid block 308, for use in generating a data valid signal.

In addition to the functions discussed above, column control 306 provides the following signals to memory core 320: 1) pre-decoded column signals (PC) 342 for bit-line selection, column address transition detection signal (NCATD) 344 for control of the column passgate (not illustrated), and secondary sense-amp signal (SECSA) 346 to enable secondary sense amps. Note that SECSA is also provided to data valid block 308 for use in generating a data valid signal.

Data valid block 308 is responsible for indicating to memory controller 154 when an access cycle is complete. Based on the state of refresh line 332, pre-charge signal 336, SECSA 346, NRATD 334 and clock lockout line 234, data valid block 308 will use data valid line 232 to send a data valid signal. In effect, when an access cycle is complete, as indicated by the appropriate internal signals provided by row control 304 and column control 306, and when memory controller 154 is ready to receive data as indicated by clock lockout 234, then data valid block 308 sends a signal over data valid line 232 indicating to memory controller 154 that a cycle is complete.

It will be appreciated that the use of the specific signals discussed above, or signals which perform similar functions, are only one embodiment of a particular "data valid" methodology. For example, in another embodiment, the NCATD signal 344 may be used instead of SECSA signal 346 to allow for more setup time between assertion of a DATA VALID signal on data valid line 232 and the valid data on read data lines 230. This, or other suitable methods, may be employed by those skilled in the art of DRAM design to achieve desired setup times, as well as to control the timing of the refresh cycle and write cycles.

Figure 4:
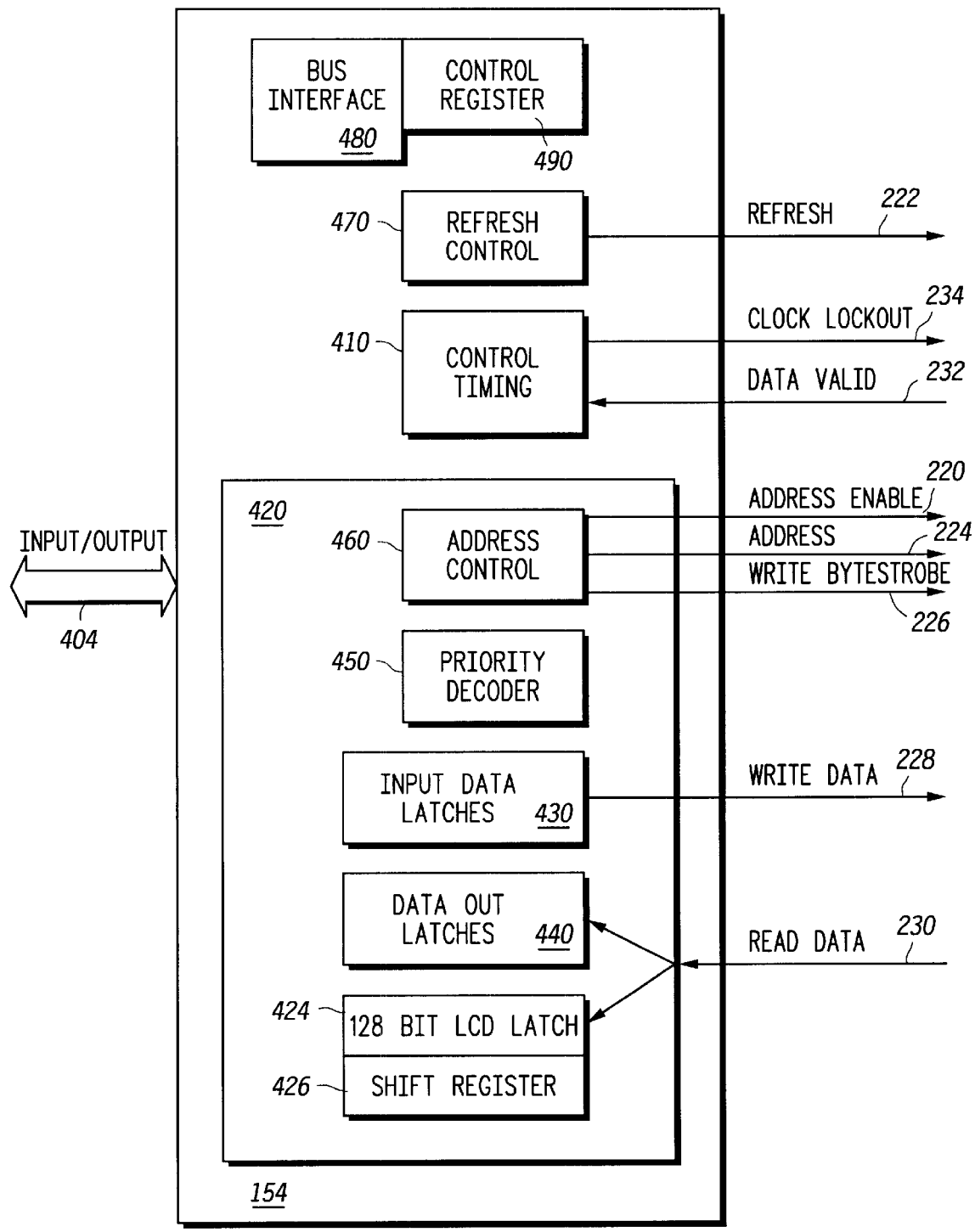
FIG. 4 is a block diagram of an embodiment of the memory controller illustrated in FIG. 2.

Referring next to FIG. 4, a particular implementation of memory controller 154 is described in greater detail. Memory controller 154 selects from among all possible resource requests received through input/output (I/O) busses 404, and gates appropriate signals to and from DRAM array 157 (FIG. 3) via refresh line 222, data valid line 232, clock lockout line 234, address enable line 220, address bus 224, write byte strobe bus 226, write data bus 228 and read data bus 230. In at least one embodiment, memory controller 154 includes bus-switch interface 420 for interfacing with DRAM array 157; control timing circuitry 410 to synchronize outputs of DRAM array 157 with the system clock; refresh control 470 to provide refresh signals to DRAM array 157 and to control reset conditions by initiating a series of refresh cycles to initiate DRAM array 157; bus interface 480 which allows connection to an internet protocol bus; and control registers 490 to allow programmability of memory controller 154.

In order to provide control functions for DRAM array 157, memory controller 154 latches all addresses, read/write signals and control signals from memory-users 110–140 (FIG. 1). Memory controller 154 then determines if a valid DRAM request has been made, determines which requestor has priority for the next access, and drives the appropriate control signals to DRAM array 157. After initiating an access cycle, memory controller 154 waits until the data from DRAM array 157 is valid, then gates the data and sends an acknowledgement to the appropriate requestor. In at least one embodiment, memory controller 154 can latch the address, data and control signals to allow a memory user, such as primary processor 120 (FIG. 1) to begin a process before receiving a response from DRAM 150 (FIG. 2).

As various request signals become active on I/O busses 404, memory controller 154 uses bus-switch interface 420 to determine if an access request is from a memory-user, to determine if the access request includes a valid DRAM address, and to prioritize access requests. Bus-switch interface 420 prioritizes access requests using priority decoder 450. Priority decoder 450 may be implemented to achieve various prioritization schemes, as needed, however, at least one embodiment uses a simple round-robin scheme to arbitrate between different requestors. For example, assume there are four requesters sharing DRAM 150, as shown in FIG. 1. If auxiliary processor 110 is assigned the highest priority, followed in descending order by primary processor 120, display 130 and ending with other requester 140 during a first period, then during the next period primary processor 120 will be assigned the highest priority, followed in descending order by display 130, other requestor 140, and ending with auxiliary processor 110 having the lowest priority.

In addition to priority decoder 450, bus-switch interface 420 also includes address control 460, input data latches 430, data out latches 440, 128 bit LCD latch 424 and shift register 426. Bus-switch interface 420 latches input data from the memory-user having priority. This data is latched using input data latches 430, and the latched data is then made available to DRAM array 157 (FIG. 3). In at least one embodiment, individual input busses that make up I/O busses 404 are only 32 bits wide, while input data latches 430 are 128 bits wide. In this case, bus-switch interface 420 routes the 32 bits of data from the appropriate individual one of I/O busses 404 into input data latches 430 according to the output of the priority decoder.

Not only the input data is latched. Data received from DRAM array 157 via read data bus 230 in response to a read request is either latched using data out latches 440 or 128 bit LCD latch 424, depending on which memory user requested the data. It should be noted that in at least one embodiment, both data out latches 440 and 128-bit LCD latch 424 have a data path 128 bits wide. In the event that data is latched in data out latches 440 and the memory-user to which the data is to be sent uses a word size less than 128 bits, data out latches 440 can serve as a multi-word, zero wait-state buffer. For example, if a central processor supports 32 bit words, then a single read request from DRAM array 157 will return 4 words to be latched in data-out latches 440. Having 128 bits of data latched results in memory controller 154 filling subsequent access requests from the same memory-user with data stored in data-out latches 440, instead of requiring DRAM array 157 to perform another read. It should be noted that in order to avoid stale data being returned from data out latches 430, the buffer data can be marked invalid anytime there is a write cycle to an address corresponding to the address from which the stored data was read.

Data returned from DRAM array 157 in response to a request from a display, such as a high data rate color LCD type display, is latched using 128-bit LCD latch 424. The latched data is then transferred to shift register 426, and shifted out as pixel data when memory controller 154 receives a pixel clock. In at least one embodiment, the 128-bit LCD latch is kept full in order to avoid starving shift register 426.

Control timing circuitry 410 keeps track of when to turn on priority decoder 450, when to drive addresses, when to write data to DRAM array 157, when to gate data read from DRAM array 157 back to requesters, and the like. Once memory controller 154 causes DRAM array 157 to begin a cycle, control timing circuitry 410 waits until it receives a DATA VALID signal over data valid line 232 before initiating any more access cycles. Since memory controller 154 operates in synchronism with the system clock, and DRAM array 157 operates asynchronously at its natural frequency, control timing circuitry 410 uses a CLOCK LOCKOUT signal over clock lockout line 234 to delay assertion of a DATA VALID signal by DRAM array 157. By use of the CLOCK LOCKOUT signal, memory controller 154 can ensure that data received from DRAM array 157 is synchronized to the system clock.

Figure 5:
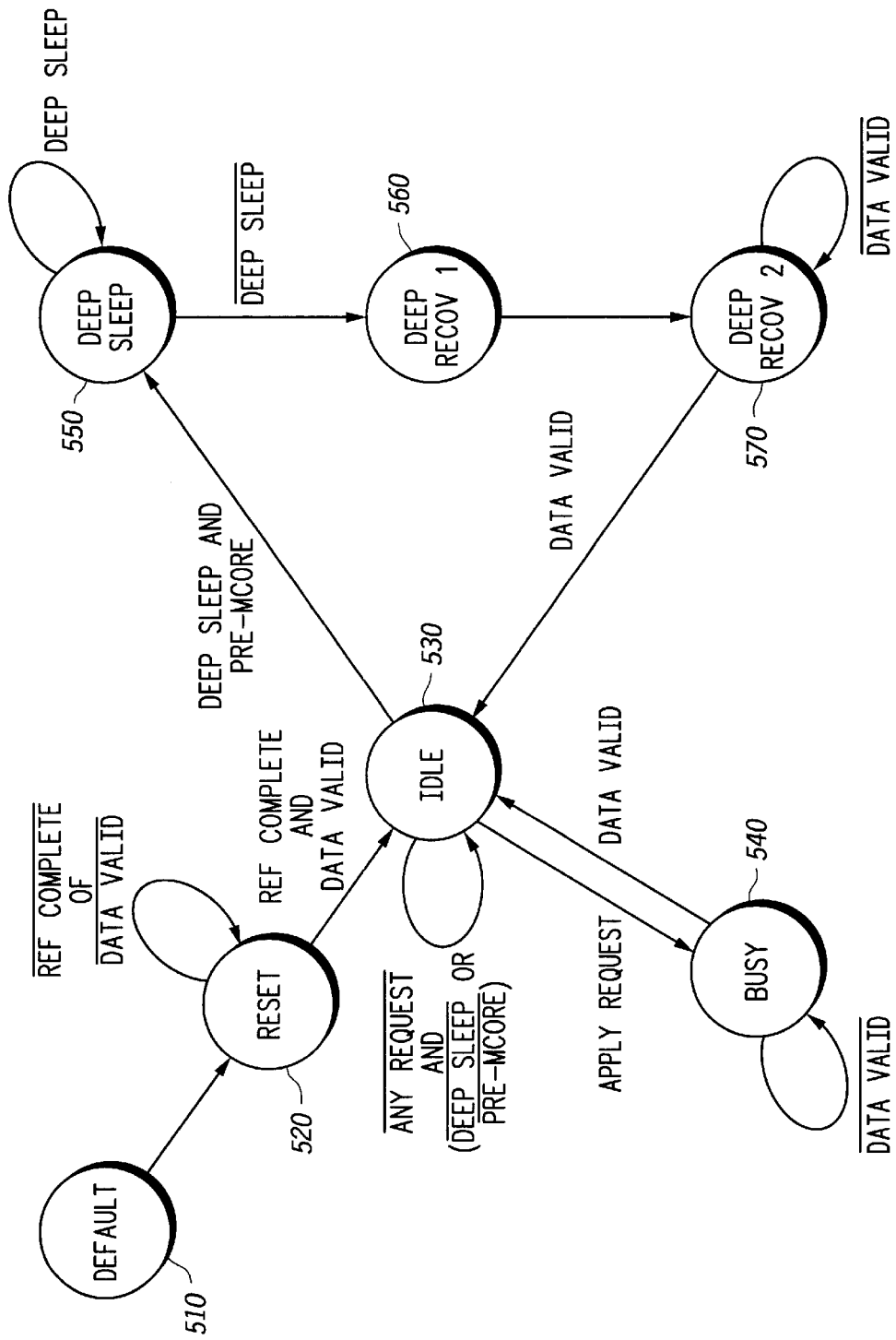
FIG. 5 is a state diagram illustrating the operation of a memory controller according to one embodiment of the present invention.

Referring next to FIG. 5, a state diagram will be used to illustrate the operation of a particular embodiment of memory controller 154 (FIG. 4). Operation of memory controller 154 begins in default state 510. From default state 510, memory controller 154 always proceeds to reset state 520. During reset state 520, a series of refresh pulses are sent to DRAM array 157 (FIG. 3), and memory controller 154 waits for a DATA VALID signal from DRAM array 157.

When the refresh cycle is complete and a DATA VALID signal is received, memory controller 154 moves into idle state 550. Memory controller 154 remains in idle state 550 until a request is received, or until a command to enter a deep sleep mode is received and the PRE-MCORE signal indicates that data stored in the 128 bit output buffer is not being. Requests include both access requests and refresh cycles. Upon receiving a request, memory controller 154 enters busy state 540, in which additional requests are queued up but not acted on yet. Memory controller 154 only leaves busy state 540 when a DATA VALID signal is received from DRAM array 157, at which point the controller returns to idle state 550.

When memory controller 154 receives a deep sleep command in idle state 530, it enters deep sleep state 550. A deep sleep command may be received, for example, during a low power state, during power failure, or when a critical processor is not operating. In at least one embodiment, deep sleep state 550 is entered only after servicing all pending requests. While in deep sleep state 550, controller 154 continues to provide refresh signals to portions of DRAM array 157 that hold data. By refreshing only those areas that are storing data, power can be conserved.

Memory controller 154 leaves deep sleep state 550 when the DEEP SLEEP command is no longer asserted, and enters deep recovery 1 state 560. Upon leaving deep sleep recovery 1 state 560, memory controller 154 automatically enters deep sleep recovery 2 state 570. Deep Sleep Recovery states 1 and 2 simply provide a two-cycle delay coming out of Deep Sleep state 550. Upon receiving a DATA VALID signal from DRAM array 157, memory controller 154 returns to idle state 550.

Figure 6:
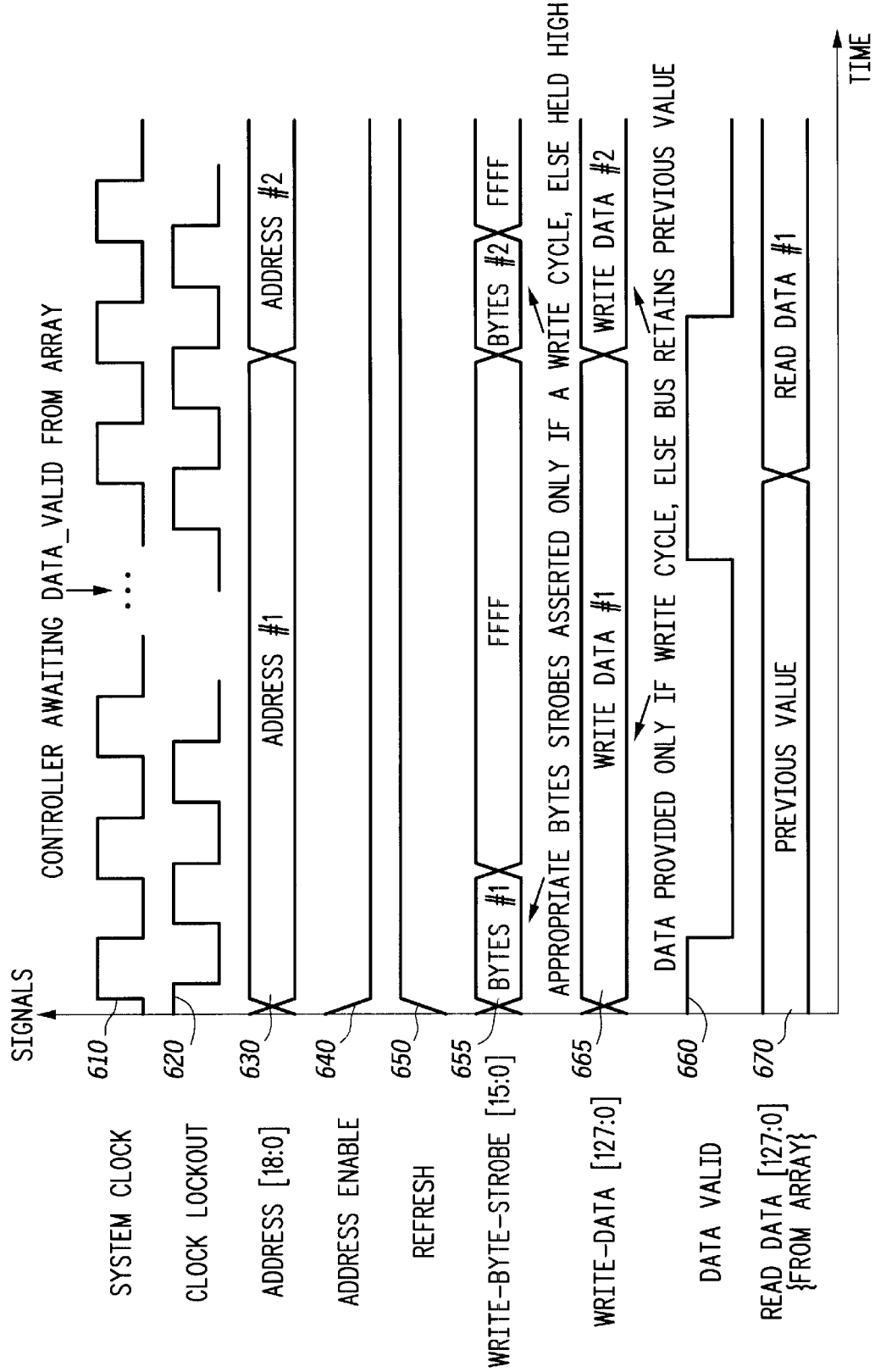
FIGS. 6–8 are timing diagrams illustrating the timing relationships of various signals within an embodiment of the DRAM illustrated in FIG. 2.

Referring next to FIG. 6, the timing of an access cycle for DRAM array 157 will be described according to one embodiment of the present invention. As mentioned earlier, memory controller 154 selects among possible request sources to determine which requester will get access to DRAM array 157. Once a priority determination has been made, memory controller 154 asserts ADDRESS ENABLE signal 640 low, if it is not already asserted low, to indicate to DRAM array 157 that an access cycle is in progress. At the same time ADDRESS ENABLE signal 640 is asserted, ADDRESS signals 630 are driven from the selected requester to DRAM array 157.

If the requested access is a write operation, then appropriate WRITE BYTE STROBE signals 655 are asserted for one cycle of system clock 610. In addition to WRITE BYTE STROBE signals 655, WRITE DATA 665 are multiplexed from the appropriate source during a write operation. If no WRITE BYTE STROBE signals are asserted, then the access is assumed to be a read operation. For both read and write operations, DRAM array 157 monitors the address lines, and begins an access cycle when a transition is detected.

It will be recalled that DRAM array 157 manages random and page accesses by analyzing ADDRESS signals 630, and that once the memory controllerl 154 signals DRAM array 157 to begin an access cycle, memory controller 154 sits and waits for DATA VALID signal 660 to be returned by DRAM array 157. DRAM array 157 provides DATA VALID signal 660 to memory controller 154 whenever an access is complete. In addition, DRAM array 157 provides READ DATA 670 upon completion of a read operation. DATA VALID signal 660 proceeds READ DATA 670 in order to provide memory controller 154 time to prepare for receipt of READ DATA 670.

One may note that DATA VALID signal 660 can be completely asynchronous to SYTEM CLOCK 610. In order to ensure that DATA VALID signal 660 is latched at the proper time, memory controller 154 sends an early version of SYSTEM CLOCK 610, CLOCK LOCKOUT signal 620, to DRAM array 157 to actually latch DATA VALID signal 660. As illustrated in FIG. 6, CLOCK LOCKOUT signal 620 leads SYSTEM CLOCK 610 by an amount of time slightly longer than the amount of time needed to capture the DATA VALID signal.

Figure 7:
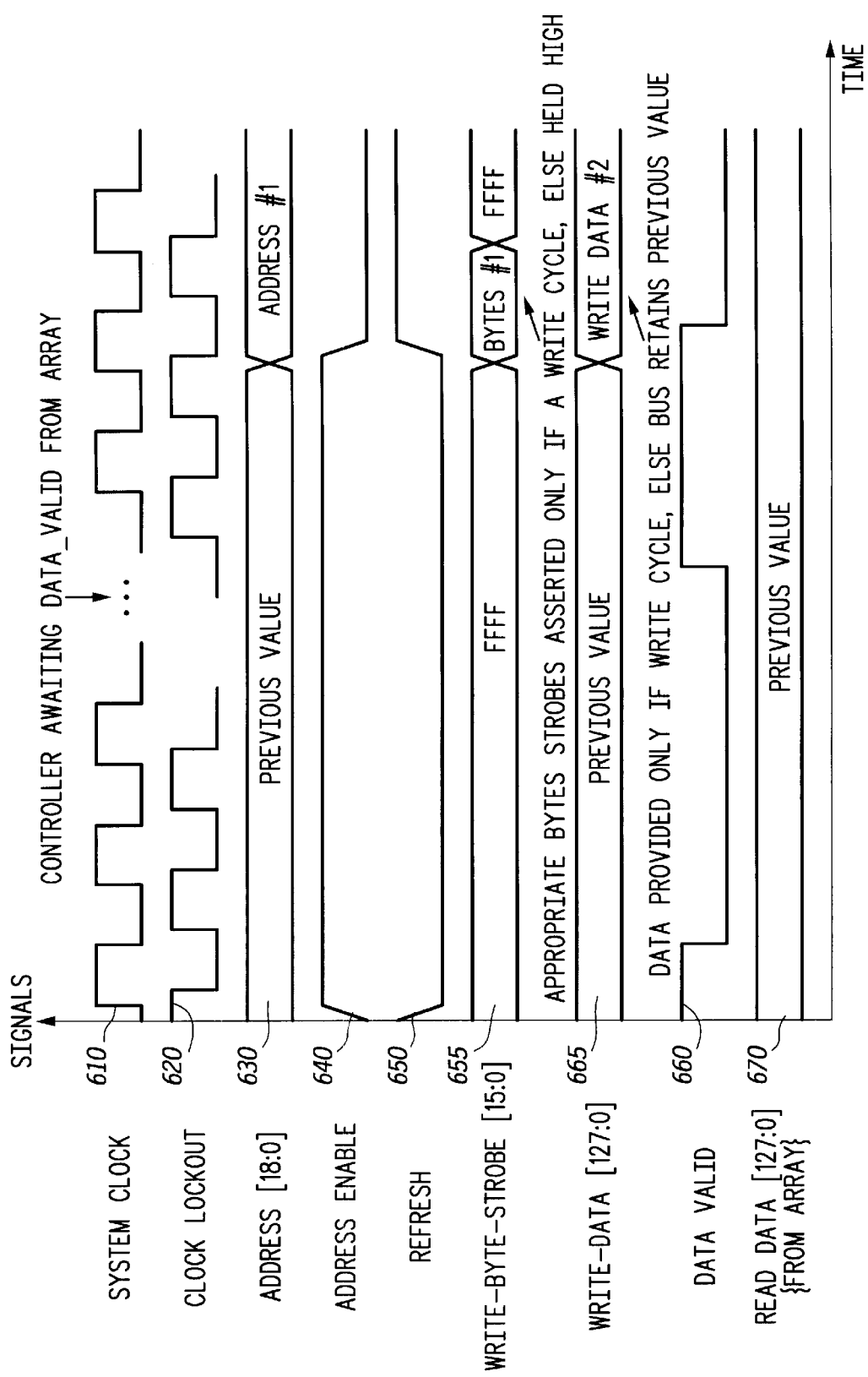

Referring next to FIG. 7, the timing of a refresh cycle for DRAM array 157 will be described according to one embodiment of the present invention. Since a DRAM is a dynamic memory, it requires refresh cycles to maintain a charge on its memory cells. In at least one embodiment, memory controller 154 samples a refresh clock to generate a one-cycle refresh request pulse. The refresh request pulse is latched and used by memory controller 154 in making priority determinations. It should be noted that the refresh request can be treated in the same manner as an access request from a memory-user for priority determination purposes. After memory controller 154 selects the refresh cycle for priority, memory controller 154 asserts REFRESH signal 650, and de-asserts ADDRESS ENABLE signal 640. Note that ADDRESS 630 and WRITE BYTE STROBE signals 655 are not changed for a refresh cycle. Also note that DRAM 157 signals completion of a refresh cycle using the same DATA VALID signal 660 as used employed to signal completion of read and write access cycles.

Figure 8:
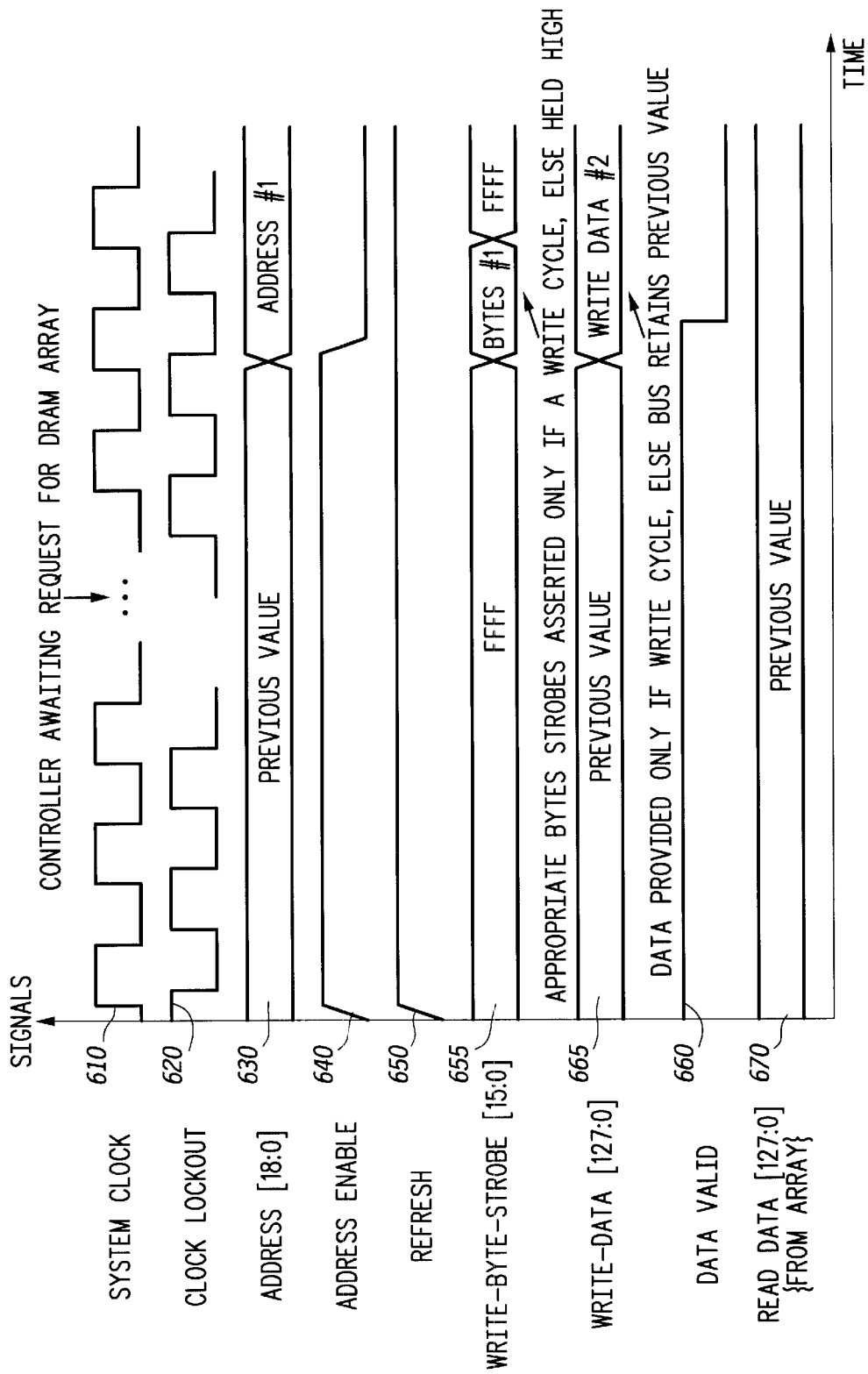

Referring next to FIG. 8, the timing of a pre-charge cycle for DRAM 150 will be described according to one embodiment of the present invention. A pre-charge cycle is generally performed under three circumstances: 1) whenever a read or write access is made to an inactive row, 2) during a refresh cycle, and 3) when no other access requests are pending for the row pointed to by an address counter internal to DRAM array 157. In the first two cases, the pre-charge is performed automatically by DRAM array 157, and is transparent to memory controller 154. In the case where no sources are requesting access to DRAM array 157, memory controller 154 will force DRAM array 157 to perform a pre-charge cycle to minimize access time in the event that the next cycle is a random access. In order to force the pre-charge cycle, the only action that must be taken by memory controller 154 is to de-assert ADDRESS ENABLE signal 640.

As will be apparent from review of the foregoing disclosure, a DRAM constructed according to the teachings set forth herein provides for increased flexibility over conventional DRAM. Since the controller portion of the DRAM is isolated from the internal timing of the array portion of the DRAM by a DATA VALID protocol, the array portion can change configurations transparent to the controller portion. If refresh time degrades, the internal number of rows for refresh can be modified to achieve a shorter refresh period with no risk of data retention error since the distributed refresh frequency is fixed. The number of rows for access can also be changed without affecting the controller portion, thereby allowing for optimal trade off between page size and power. Also, bank architectures which overlap pre-charge cycles with row accesses can be enabled without any change in the controller portion of the DRAM. Finally, the performance of the DRAM can be maximized at all temperature and voltage corners, rather than having to settle for a "worst-case" performance limit.

In the preceding detailed description of the figures, reference has been made to the accompanying drawings which form a part thereof, and in which is shown by way of illustration specific embodiments in which the invention may be practiced. These embodiments are described in sufficient detail to enable those skilled in the art to practice the invention, and it is to be understood that other embodiments may be utilized and that logical, mechanical, chemical, and electrical changes may be made without departing from the spirit or scope of the invention. To avoid detail not necessary to enable those skilled in the art to practice the invention, the description may omit certain information known to those skilled in the art. Furthermore, many other varied embodiments that incorporate the teachings of the invention may be easily constructed by those skilled in the art. Accordingly, the present disclosure is not intended to be limited to the specific form set forth herein, but on the contrary, it is intended to cover such alternatives, modifications, and equivalents, as can be reasonably included within the spirit and scope of the invention. The preceding detailed description is, therefore, not to be taken in a limiting sense, and the scope of the present disclosure is defined only by the appended claims.

What is claimed is:

1. A memory comprising:
   a controller including a bus-switch interface, said controller operating in synchronization with a system clock; and
   a dynamic random access memory (DRAM) array to interface with said controller, said DRAM operating at a natural frequency independent of said system clock, and having inputs and outputs synchronized to said controller.

2. The memory as in claim 1, wherein said DRAM array comprises:
   a row decoder; and
   a column decoder.

3. The memory as in claim 1, wherein said memory further comprises a data valid line to provide a data valid signal from said DRAM array to said controller.

4. The memory as in claim 3, wherein said memory further comprises a clock lockout line to provide a clock lockout signal from said controller to said DRAM array, the clock lockout signal to inhibit the data valid signal from being provided to said controller until said controller is prepared to receive data.

5. The memory as in claim 1, wherein said controller comprises:
   a first data latch to hold multiple words of data to be used by a first requester; and
   a second data latch to hold data to be used by a display.

6. An embedded dynamic random access memory (DRAM) comprising:
   a controller portion operating in synchronization with a system clock;
   an array portion operating at a natural frequency independent of said system clock; and
   an interface between said controller portion and said array portion, said interface including:
   a data valid line to provide a datavalid signal from said array portion to said controller portion; and
   a clock lockout line to provide a clock lockout signal from said controller portion to said array portion to inhibit said array portion from providing the data valid signal until said controller portion is prepared to receive data.

7. The embedded DRAM as in claim 6, wherein said array portion comprises:

a row decoder; and a column decoder.

8. The embedded DRAM as in claim 7, wherein said controller portion comprises a bus-switch interface.

9. The embedded DRAM as in claim 6, wherein said controller portion comprises:

a first data latch to hold multiple words of data to be used by a first requester; and a second data latch to hold data to be used by a display.

10. A system comprising:

a system clock;

a data bus;

a first data requestor coupled to said data bus;

a second data requestor coupled to said data bus; and a memory coupled to said data bus and shared by said first data requestor and said second data requestor, said memory including:

a controller including a bus switch interface, said controller operating in synchronization with said system clock; and a dynamic random access memory (DRAM) array to interface with said controller, said DRAM operating at a natural frequency independent of said system clock, and having inputs and outputs synchronized to said controller.

11. The system as in claim 10, wherein said DRAM array comprises:

a row decoder; and a column decoder.

12. The system as in claim 10, wherein said memory further comprises a data valid line to provide a data valid signal from said DRAM array to said controller.

13. The system as in claim 12, wherein said memory further comprises a clock lockout line to provide a clock lockout signal from said controller to said DRAM array, the clock lockout signal to inhibit the data valid signal from being provided to said controller until said controller is prepared to receive data.

14. The system as in claim 10, wherein:

said system comprises a display; and said controller comprises:

a first data latch to hold multiple words of data to be used by a first requestor; and a second data latch to hold data to be used by a display.

15. A method comprising the steps of:

receiving, at a controller operating in synchronization with a system clock, a request for memory access;

providing, in response to the request, a control signal to a dynamic random access memory (DRAM) array operating asynchronously with the system clock; and receiving, from the DRAM array, a data valid signal indicating completion of an action performed in response to the control signal.

16. The method as in claim 15, wherein the step of providing a control signal comprises providing a clock lockout signal to the DRAM array to inhibit the DRAM array from providing the data valid signal to the controller until the controller is prepared to receive data.

17. The method as in claim 15, wherein the step of providing a control signal comprises providing a write byte strobe to indicate a write operation.

18. The method as in claim 15, wherein the step of providing a control signal comprises providing a refresh signal to initiate a refresh cycle in the DRAM array.

* * * * *